US008089322B2

(12) United States Patent
Beccue et al.

(10) Patent No.: US 8,089,322 B2
(45) Date of Patent: Jan. 3, 2012

(54) INDUCTANCE ENHANCED ROTARY TRAVELING WAVE OSCILLATOR CIRCUIT AND METHOD

(76) Inventors: Stephen M Beccue, Oxnard, CA (US); Anh D Pham, San Jose, CA (US)

( * ) Notice: Subject to any disclaimer, the term of this patent is extended or adjusted under 35 U.S.C. 154(b) by 0 days.

(21) Appl. No.: 12/465,890

(22) Filed: May 14, 2009

(65) Prior Publication Data

US 2010/0117749 A1    May 13, 2010

Related U.S. Application Data

(60) Provisional application No. 61/053,637, filed on May 15, 2008.

(51) Int. Cl.
  *H03B 5/18* (2006.01)
(52) U.S. Cl. ......... 331/96; 331/99; 331/107 DP; 331/57
(58) Field of Classification Search .............. 331/57, 331/96, 99, 107 DP, 107 SL, 117 D; 333/219, 333/236
See application file for complete search history.

(56) References Cited

U.S. PATENT DOCUMENTS

| | | | |
|---|---|---|---|
| 4,686,407 A | 8/1987 | Ceperley | |
| 4,749,963 A | 6/1988 | Makimoto et al. | |
| 5,584,067 A | 12/1996 | Buer et al. | |
| 6,525,618 B2 * | 2/2003 | Wood | 331/57 |
| 6,556,089 B2 | 4/2003 | Wood | |
| 7,218,180 B2 * | 5/2007 | Wood | 331/96 |
| 2004/0240126 A1 | 12/2004 | Tiemeijer | |
| 2005/0068116 A1 | 3/2005 | Ham et al. | |
| 2005/0068146 A1 | 3/2005 | Jessie | |
| 2005/0156680 A1 | 7/2005 | Wood | |

FOREIGN PATENT DOCUMENTS

| | | |
|---|---|---|
| EP | 0696843 | 2/1996 |
| GB | 2349524 | 1/2000 |

OTHER PUBLICATIONS

The effect of copper design rules on inductor performance, Phillips Research Laboratories, C. Detcheverry et al. Sep. 16, 2003.
50 GHz Interconnect Design in Standard Silicon Technology, Center For Integrated Systems, Stanford University, Stanford, CA. Kleveland, B. et al., 1998 IEEE MSS-S Digest.
Line Inductance Extraction and Modeling in a Real Chip with a Power Grid, Center for Integrated Systems, Stanford University, Stanford, CA. Kleveland, B., et al. 1999 IEEE.

(Continued)

*Primary Examiner* — Ryan Johnson
(74) *Attorney, Agent, or Firm* — IPxLaw Group LLP

(57) ABSTRACT

An inductance enhanced rotary traveling wave oscillator is disclosed. Portions of the transmission line conductors are increased in length and run in parallel. Because the currents in these portions travel in the same direction, the inductance of these inductors is increased. By controlling the length of the transmission line conductors in these areas compared to the lengths in which the currents travel in opposite directions, the overall impedance of the oscillator can be increased. Increased impedance leads to lower power, higher Q, and lower phase noise for the oscillator. Additionally, the folded nature of the transmission line conductors permits a longer length of transmission line conductors to be routed in a smaller area. The folded nature also permits placement of the devices to take into account their switching delays. A folded circular version of the oscillator is possible, leading to improved access to phase taps on the oscillator.

19 Claims, 13 Drawing Sheets

OTHER PUBLICATIONS

RF-CMOS Oscillators with Switched Tuning, Kral, A, et al. IEEE 1998 Custom Integrated Circuits Conference.

A 40Gb/s Clock and Data Recovery Circuit in 0.18 um CMOS Technology, Lee et al. 2003 IEEE International Solid-State Circuits Conference.

Solid and Litz-Wire Winding Non-linear Resistance Comparison, Reatti, A et al., Proc. 43rd IEEE Midwest Symp. on Circuits and Systems, Lansing MI, Aug. 8, 2000. IEEE.

Integrated CMOS Transmit-Receive Switch Using On-Chip Spiral Inductors, Phd dissertation, Stanford University, Talwalkar, Dec. 2003.

Modeling and Design of Planar Integrated Magnetic Components, MSEE dissertation, Wang, Shen Virginia Polytechnic Institute, Jul. 21, 2003.

Miniature Stripline Dual-mod Ring Resonators and Their Application to Oscillating Devices, Yabuki, et al., 1995 IEEE MSS-S Digest, 1995 IEEE.

On-chip Spiral INductors with Patterned Ground Shields for Si-Based RF IC's, Cetner For Integrated Systems, Stanford University, Stanford, CA. IEEE Journal of Solid State Circuits, vol. 33, No. 5, May 1998.

* cited by examiner

INDUCTANCE ENHANCED ROTARY TRAVELING WAVE OSCILLATOR CIRCUIT AND METHOD

CROSS-REFERENCE TO RELATED APPLICATIONS

This application claims priority to and incoporates by reference U.S. Provisional Application 61/053,637, filed on May 15, 2008, titled "INDUCTANCE ENHANCED ROTARY TRAVELING WAVE OSCILLATOR CIRCUIT AND METHOD."

FIELD OF THE INVENTION

The present invention relates generally to rotary traveling wave oscillators and more particularly to an inductance-enhanced version of such oscillators. Additionally, the invention relates to improvements to inductors.

DESCRIPTION OF THE RELATED ART

Rotary traveling wave oscillators (RTWO) are described in U.S. Pat. No. 6,556,089, which is hereby incorporated by reference in its entirety. FIG. 1 shows the general arrangement of the oscillator, which includes a pair of conductors acting as a transmission line, an odd number of phase-reversing elements, such as cross-overs, connected to the conductors, and a plurality of regeneration elements. In FIG. 1, the transmission line includes conductors 15a and 15b and one cross-over, 19, an odd number of cross-overs being needed to maintain oscillations on the transmission line. FIG. 1 also shows a plurality of regeneration elements 21, connected at spaced apart positions along the transmission line and between the conductors 15a and 15b of the line. The regeneration elements establish a traveling wave on the line and maintain the wave by supplying energy to the line to make up for small losses.

FIG. 2 illustrates one embodiment of a regeneration element, a pair of cross-coupled CMOS inverters. The p-channel transistor of each inverter is connected between a first potential, VDD, and a conductor of the transmission line. The n-channel transistor is connected between that same conductor of the transmission line and a second potential, VSS. In each inverter, the input to the gates of both transistors is the other conductor of the transmission line, thereby cross-coupling the inverters. As a wave travels past them, the cross-coupled inverters switch, supplying energy to the wave to maintain its amplitude. As long as a regeneration element exhibits negative resistance, it can perform the function of starting and maintaining a traveling wave on the line. For example, the regeneration devices of Ser. No. 11/463,844, can perform the needed function.

FIG. 3 shows one way to connect a regeneration element to the line. Such a connection biases the direction of rotation of the wave, because the wave arrives at the gates of the inverters before it arrives at their drains, as described in U.S. Pat. No. 7,218,180, which is hereby incorporated by reference in its entirety. This gives the cross-coupled inverters the time they need to switch just as the wave arrives at their outputs. Because the switching is carefully timed, the regeneration element does not appreciably disturb the period of the oscillator, thereby resulting in low phase noise.

FIG. 4 shows a folded rotary clock, which is described in the U.S. Pat. No. 7,218,180 patent. The folded rotary clock has six folds and one cross-over. As described in the '180 patent, the folds have the advantage of providing a convenient way of making connections to the regeneration element to bias the wave in a particular direction.

FIG. 5 shows in detail the connection of a regeneration element on a folded line so that the traveling wave is biased to travel in a particular direction. Note that the time for a wave to reach the drain of an inverter after it reaches the gate is determined by the length of the fold. In the inset 86 shown, the wave arrives at location 100, the gate of inverter 94, before it arrives at location 102, the drain of inverter 94. This arrangement thus allows for the length of the fold to be tailored the delay of the inverter.

BRIEF SUMMARY OF THE INVENTION

One embodiment of the present invention is a rotary traveling wave oscillator. The oscillator includes one or more conductive segments, an odd number of passive connection means, and a plurality of regeneration elements. Each of the conductive segments has a length of spaced apart first and second conductors between its ends, and a first characteristic inductance per unit length, where each length of conductor being electrically continuous. Each of the odd number of passive connection means has a length of spaced apart first and second conductors coupling to the ends of the one or more segments to form a closed loop of segments and the passive connection means and each has a second characteristic inductance per unit length. The plurality of regeneration devices are located at various spaced-apart positions on the loop and connected between the first and second conductors of a segment. The regeneration devices are operative to establish and maintain on the loop a wave traveling around the loop, where the traveling wave includes a voltage wave between the first and second conductors and a single lap of the wave around the loop defines a propagation time. Each of the passive connection means causes the voltage of the traveling wave between the first and second conductors to reverse polarity, so that, at any location on a segment, there is a pair of oppositely phased oscillations having a period equal to twice the propagation time. The first and second conductors of the passive connection means have a length that is substantially longer than the length of the segments and the second characteristic inductance is greater than the first characteristic inductance.

In one embodiment, the impedance of the loop is substantially increased due to the increased inductance of the conductors of the passive connection means.

In one embodiment, the first and second conductors of a segment carry currents in opposite directions and the first and second conductors of the passive connection means carry currents in the same direction.

In one embodiment, the first and second conductors of a passive connection means are routed so as to be disposed on two sides of an area, the other two sides of which are bounded by the first and second conductors of a segment.

One advantage of the present invention is that the power needed to operate the oscillator is decreased.

Another advantage is that the phase noise is improved.

Yet another advantage is that the regeneration elements are conveniently connected to the oscillator so as to bias the traveling wave in a particular direction.

Yet another advantage is that the oscillator layout can take into account the delays of the regeneration elements.

Yet another advantage is that the oscillator can be laid out in a smaller area.

Yet another advantage is that a large number of phases are conveniently available from the oscillator.

BRIEF DESCRIPTION OF THE DRAWINGS

These and other features, aspects and advantages of the present invention will become better understood with regard to the following description, appended claims, and accompanying drawings where:

DETAILED DESCRIPTION OF THE INVENTION

Figure 6:
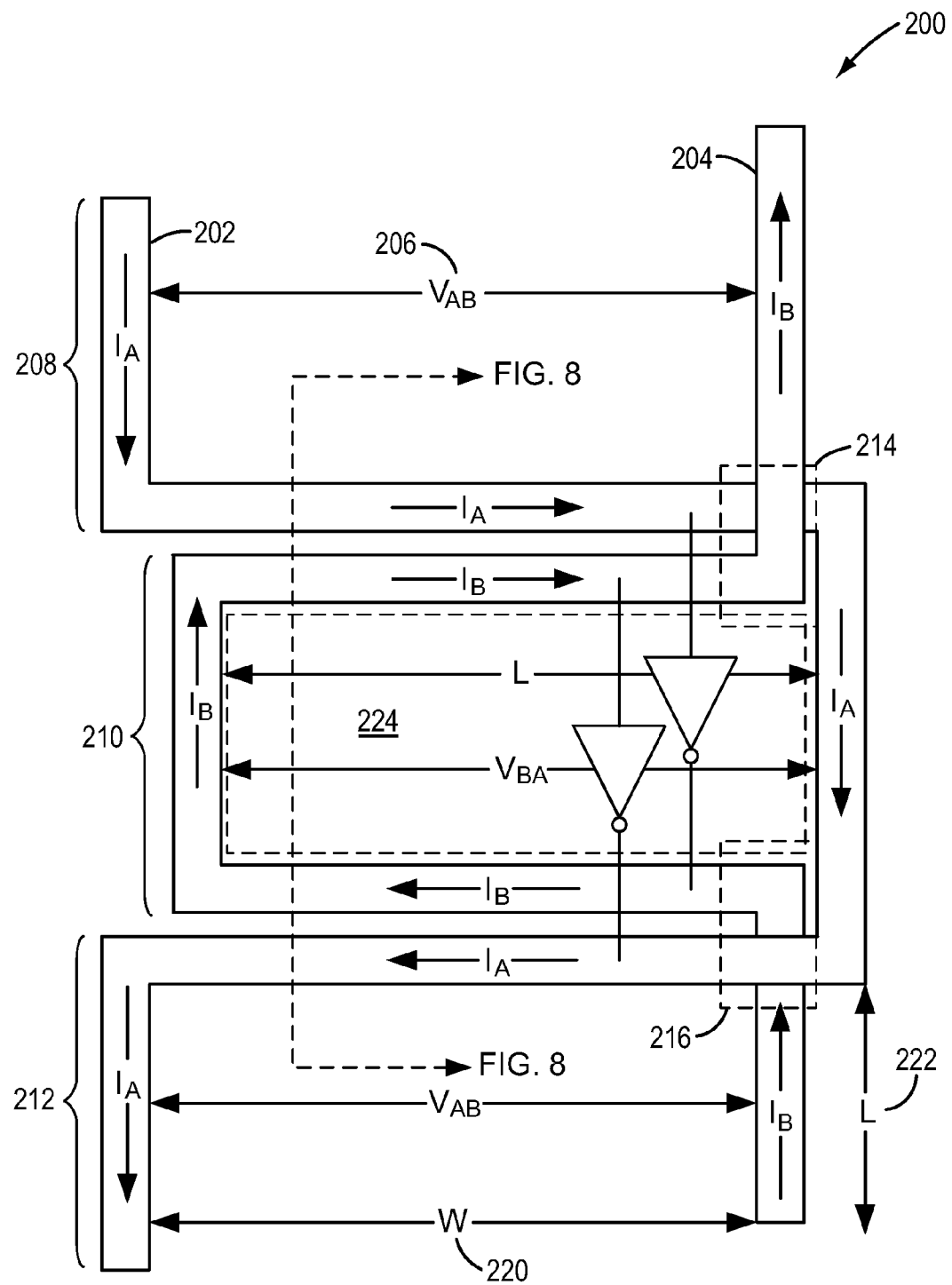
FIG. 6 shows an embodiment of the present invention.

FIG. 6 shows an embodiment 200 of the present invention. In this embodiment, a portion 202 of a pair of transmission line conductors of a rotary traveling wave oscillator carries the traveling wave. Current $I_A$ flows in one conductor A 202 and current $I_B$ flows in the other conductor B 204. A voltage $V_{AB}$ 206 is present between the two conductors, where conductor A is assumed to be more positive on the upper section 208 of the line, where conductor B is more positive in the middle section 210 of the line, and where conductor A is more positive again on the bottom section 212. Therefore, the portion of transmission line depicted includes two cross-overs. One cross-over 214 reverses the polarity of the wave between section 208 and section 210 and the other cross-over 216 reverses the polarity of the wave between section 210 and 212. Instead of minimizing the coupling between the conductors crossover each other, as suggested in the U.S. Pat. No. 6,556,089 patent, the cross-overs in the present invention attempt to maximize the coupling between the conductors, so much so that the cross-overs constitute a major portion of the length of the transmission line. In fact, in the present invention the goal is to make the length of the horizontal runs W 220 depicted much longer than the vertical runs L 222. In one embodiment, the W/L ratio is approximately 3. However, this ratio is a design parameter that is selected to achieve a desired impedance as well as a gate-offset delay for the regeneration elements. An advantage of forming the loop with horizontal and vertical runs is that it is more compact, a significantly longer length of transmission line fitting into a smaller area.

Figure 1:
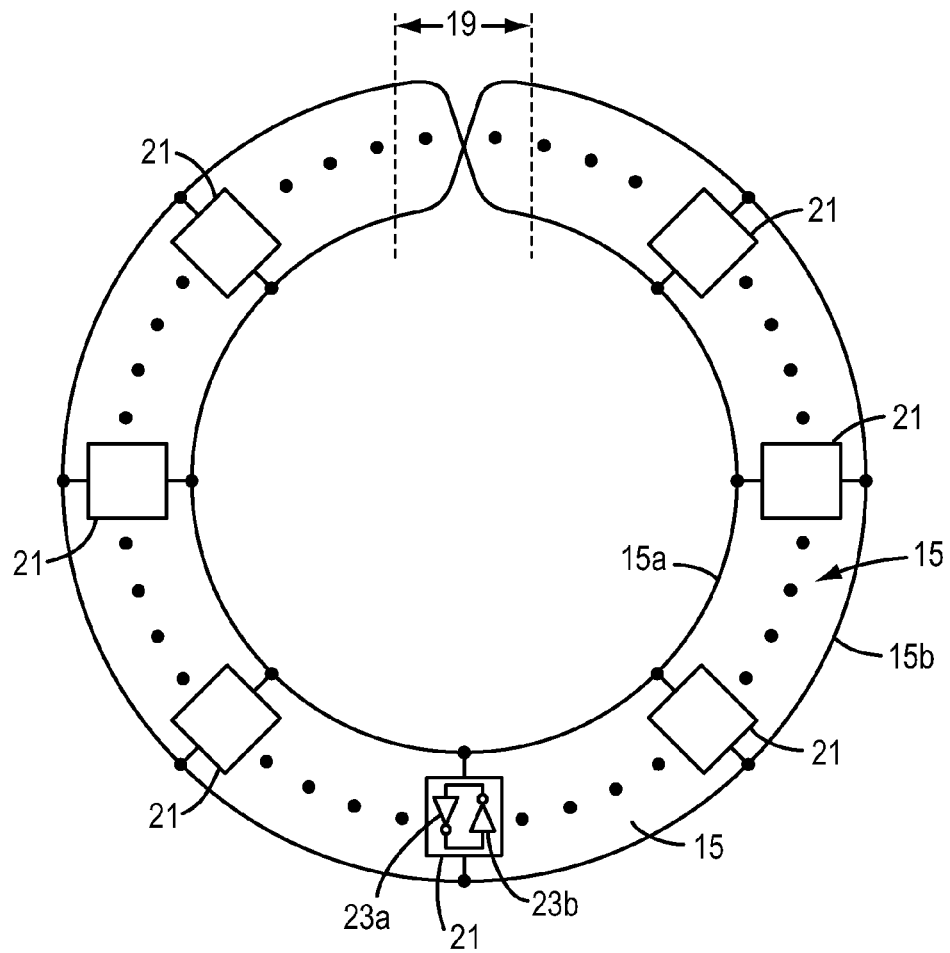
FIG. 1 shows the general arrangement of a rotary traveling wave oscillator.
Figure 2:
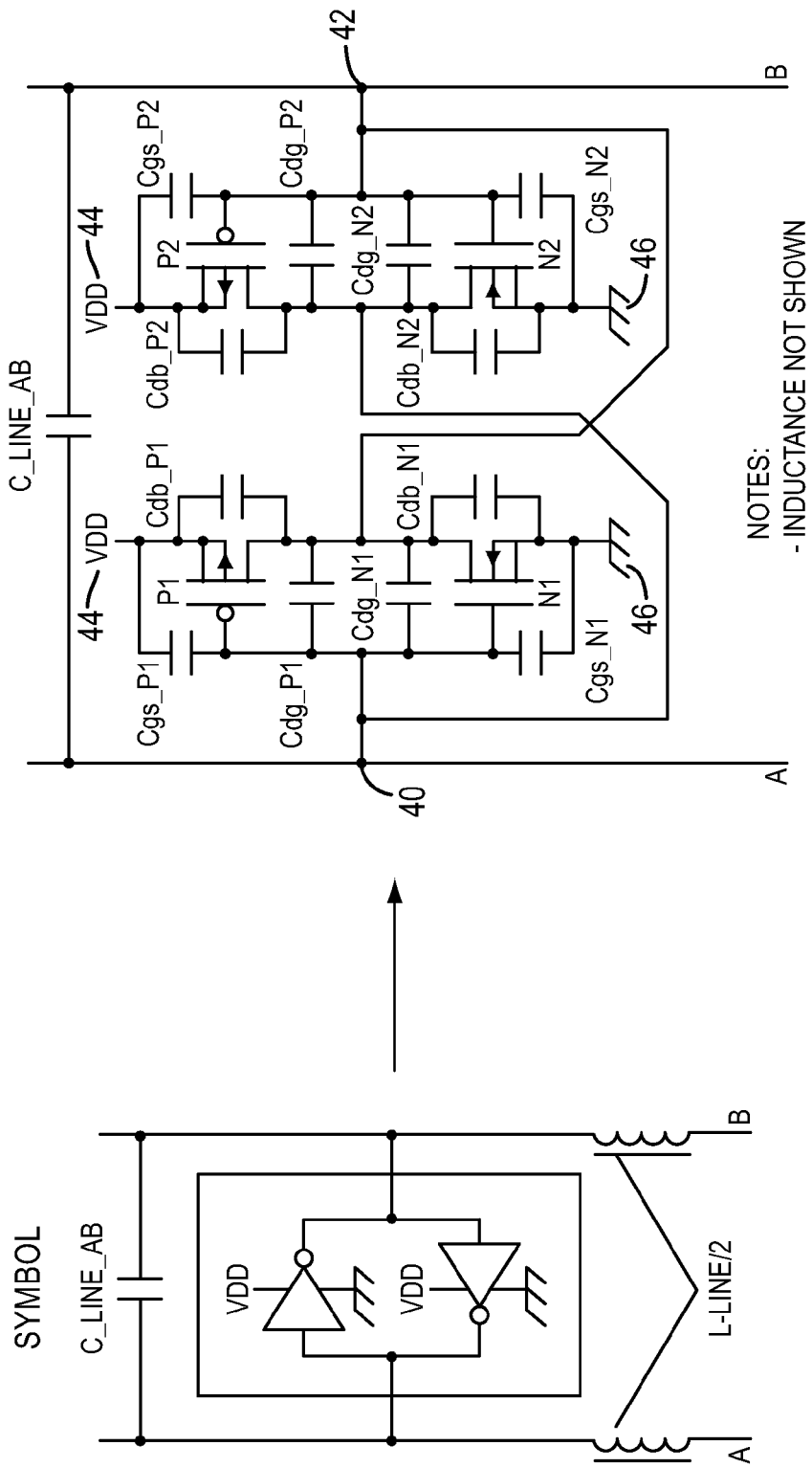
FIG. 2 illustrates one embodiment of a regeneration device, that of a pair of cross-coupled inverters.
Figure 3:
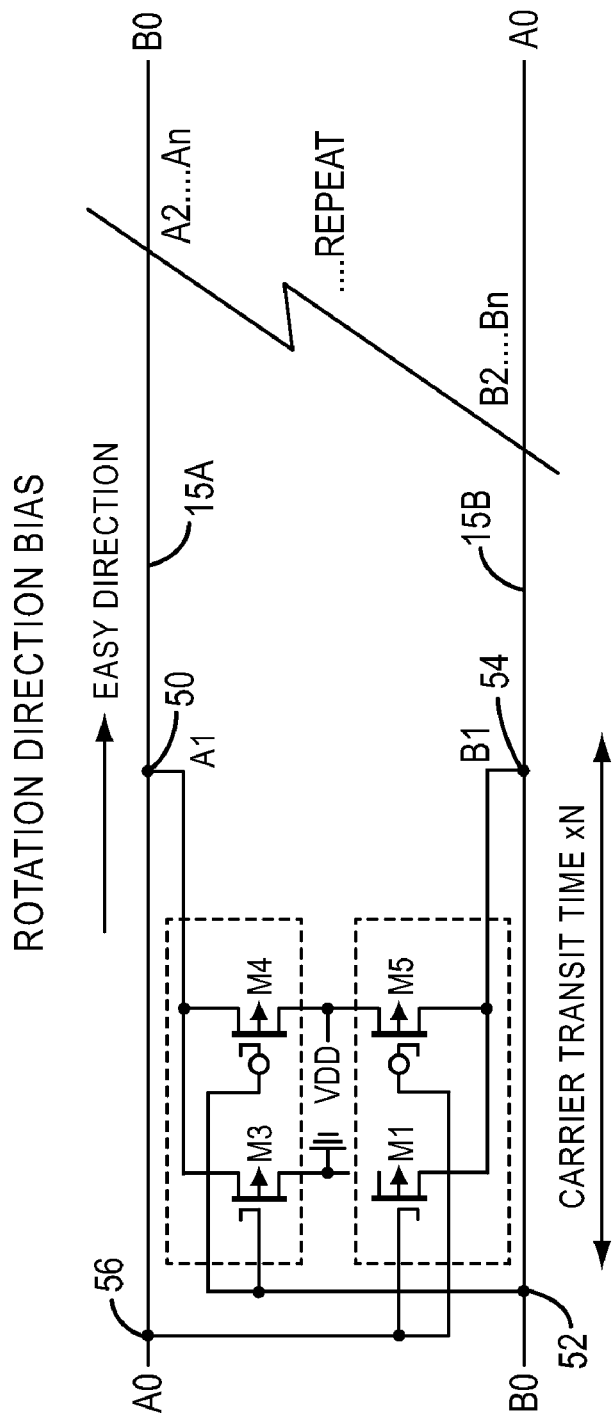
FIG. 3 shows one way to connect a regeneration device to the line.
Figure 4:
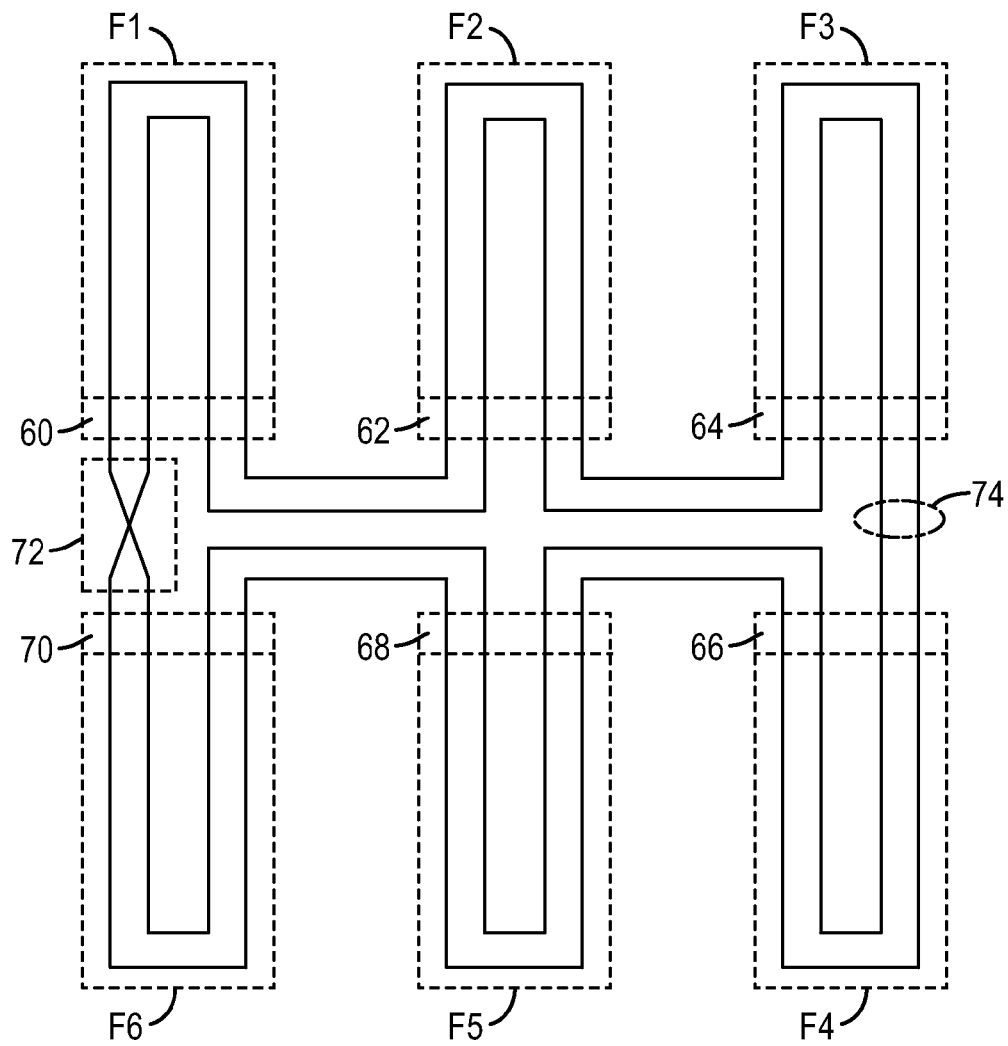
FIG. 4 shows a folded rotary clock as described in the U.S. Pat. No. 7,218,180 patent.
Figure 5:
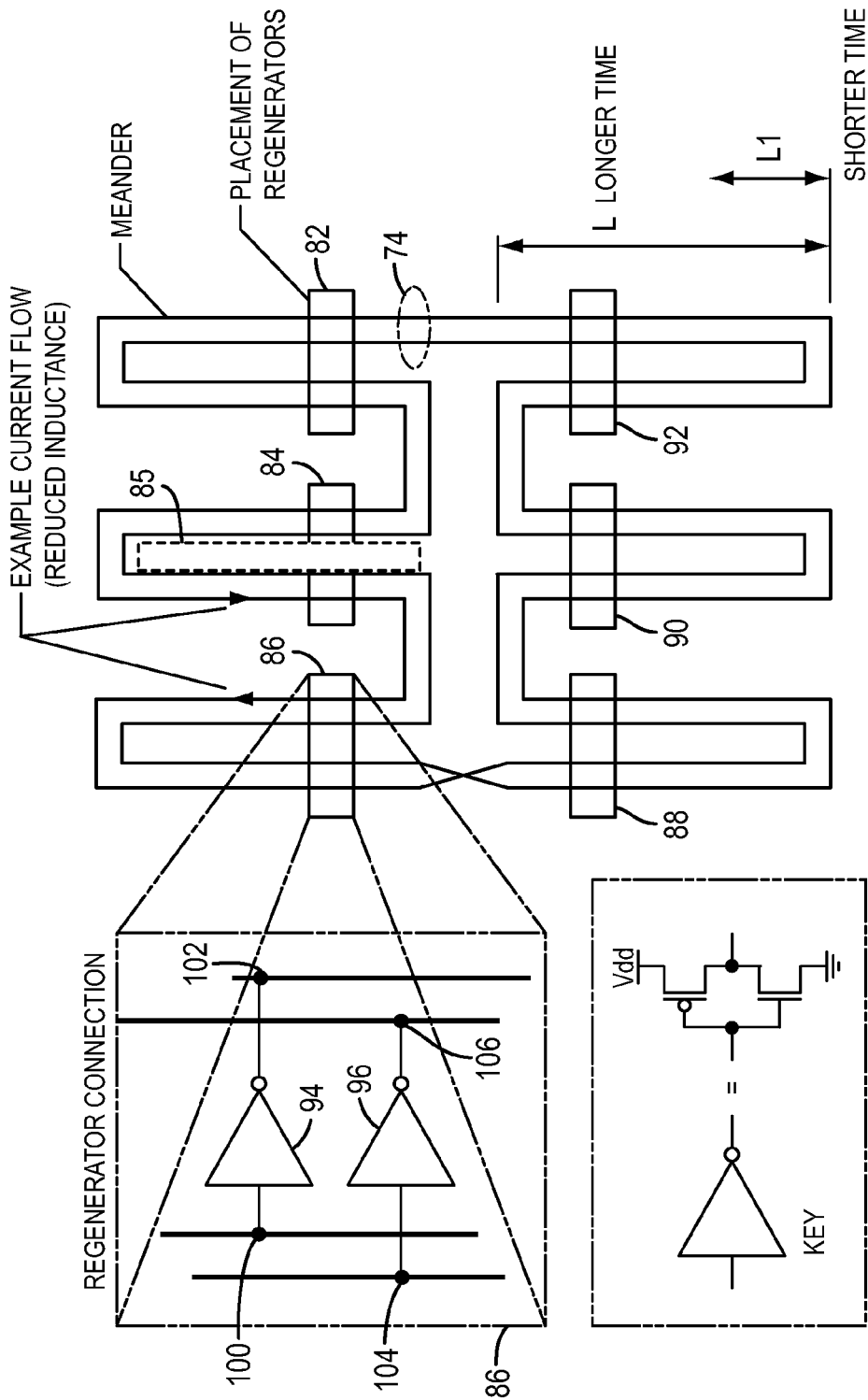
FIG. 5 shows in detail the connection of a regeneration element on a folded line to bias a wave for travel in a particular direction.

An important property of the embodiment illustrated in FIG. 6 is that the magnetic flux Φ over the area 224 is four times that over the area 85 of the fold shown in FIG. 5. The reason is that the currents surrounding the area are twice as great, with approximately equal currents $I_A$ and $I_B$ adding in the adjacent horizontal conductors of sections 208 and 212. Therefore, the embodiment increases the inductance of the conductors by four times.

Increasing the inductance of the transmission line leads to an increase in the impedance of the line according to the relationship $Z_0=\sqrt{L/C}$, where L is the differential inductance per unit length and C is the differential capacitance per unit length of line. For example, increasing the inductance by a factor of four and holding the capacitance unaltered, increases the impedance by a factor of two. The higher impedance of the line has some very positive effects. One benefit is that the power of a wave on the line is reduced by a factor of two, because half as much current is needed for a given differential voltage between the conductors. Another effect is that the phase noise is improved by about 3 dB, which is equivalent to twofold improvement. The phase noise improvement stems from an improvement in the Q factor ($Q=\omega L/R$). Specifically, due to the inductance enhancements, the inductance per unit length increases by about a factor of four, but the series resistance of the line doubles. This causes a doubling in the Q, and thus a lowering of the phase noise. If a figure of merit for oscillators can be defined as the product of the power and phase noise, then the change in the figure of merit for the embodiment of FIG. 5 is about fourfold, about the same as the inductance increase.

Figure 8:
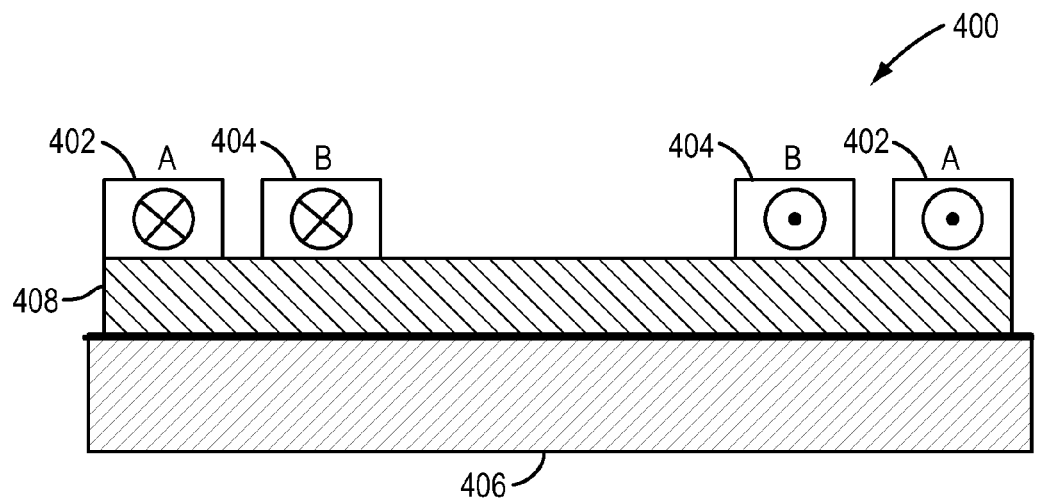
FIG. 8 shows a cross-section of the embodiment of FIG. 6.

FIG. 8 shows a cross-section 400 of the embodiment of FIG. 6. The conductors A 402 and B 404 are shown as separated from a ground plane 406 by any convenient and suitable insulator 408, depending on whether the lines are implemented on a PC board or an integrated circuit.

Figure 7:
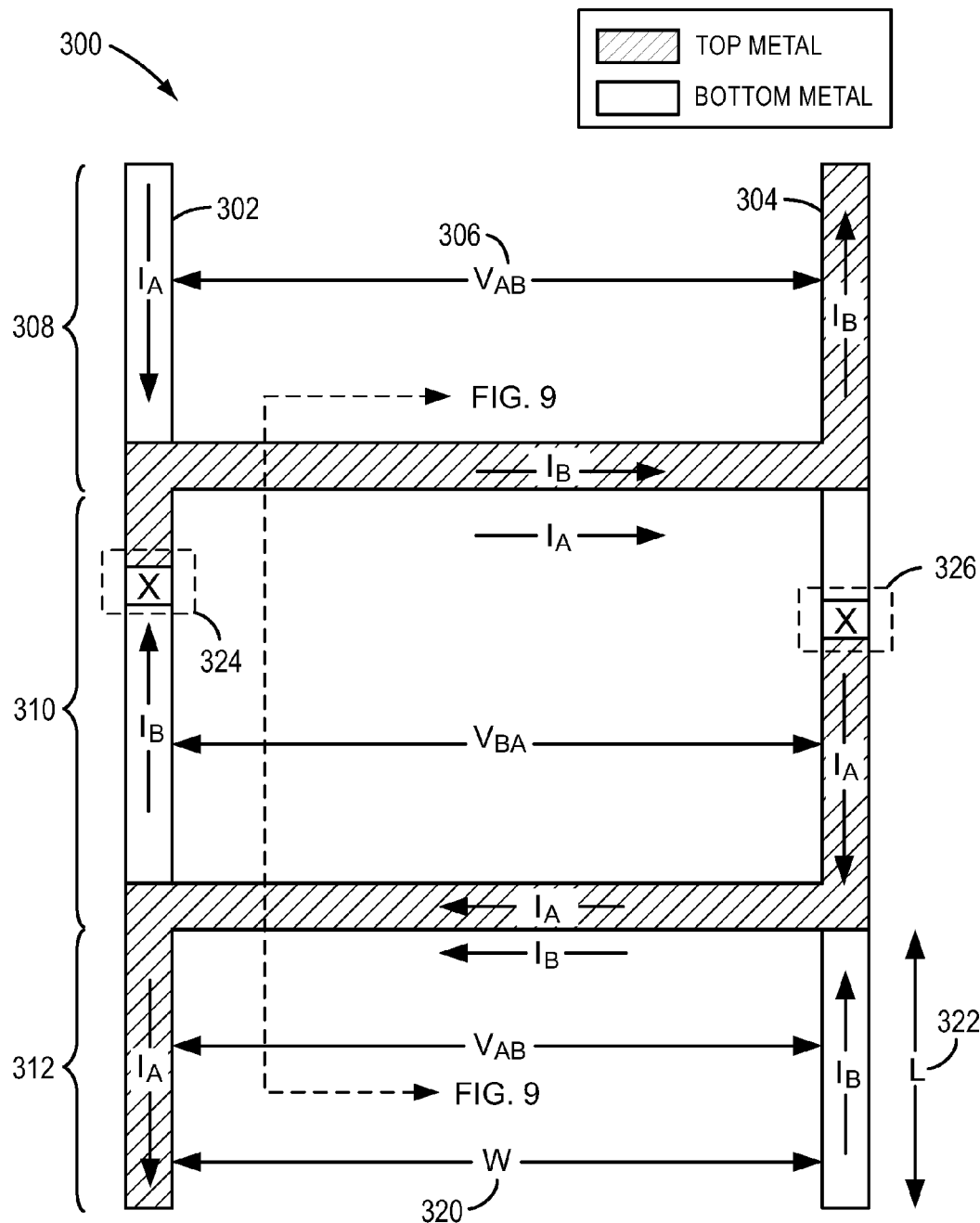
FIG. 7 shows a second embodiment of the present invention.

FIG. 7 shows a second embodiment 300 of the present invention. In this embodiment, the horizontal runs of the A and B conductors stacked on top of each other and a crossover is implemented by one or more feedthroughs or vias 324, 326 between the top metal and the bottom metal. Thus, the conductor with current $I_A$ flows on the left and under the conductor with current $I_B$ in section 308 and the conductor with $I_A$ on the right flows on the top of the conductor with $I_B$ in section 310.

Figure 9:
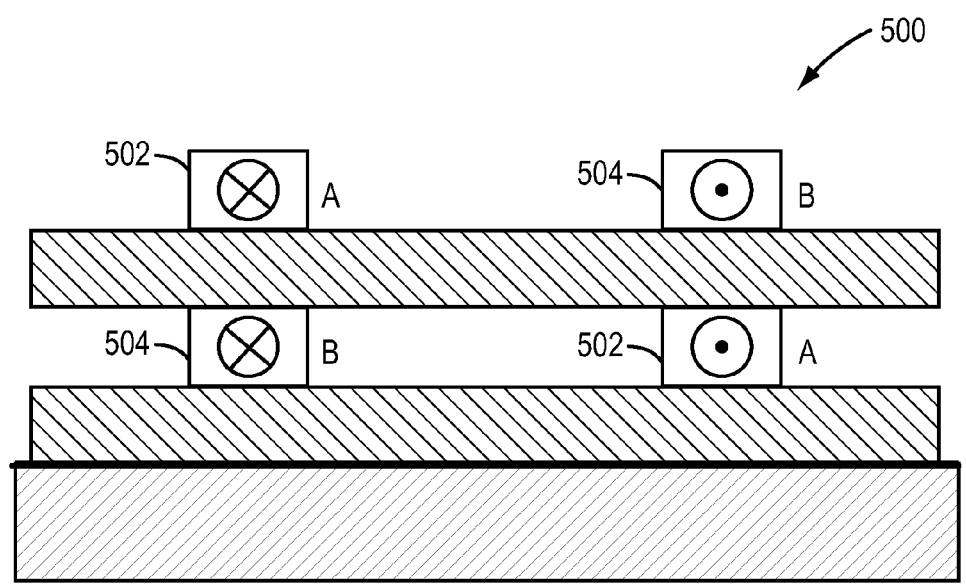
FIG. 9 shows a cross-section of the embodiment in FIG. 7.

FIG. 9 shows a cross-section of the embodiment in FIG. 7. In this embodiment, the A conductor on the left is disposed over an insulator, which is, in turn, disposed over the B conductor. The B conductor on the right is similarly disposed over the A conductor. In both cases, the conductors are insulated from the ground plane with a suitable insulator.

Figure 10A:
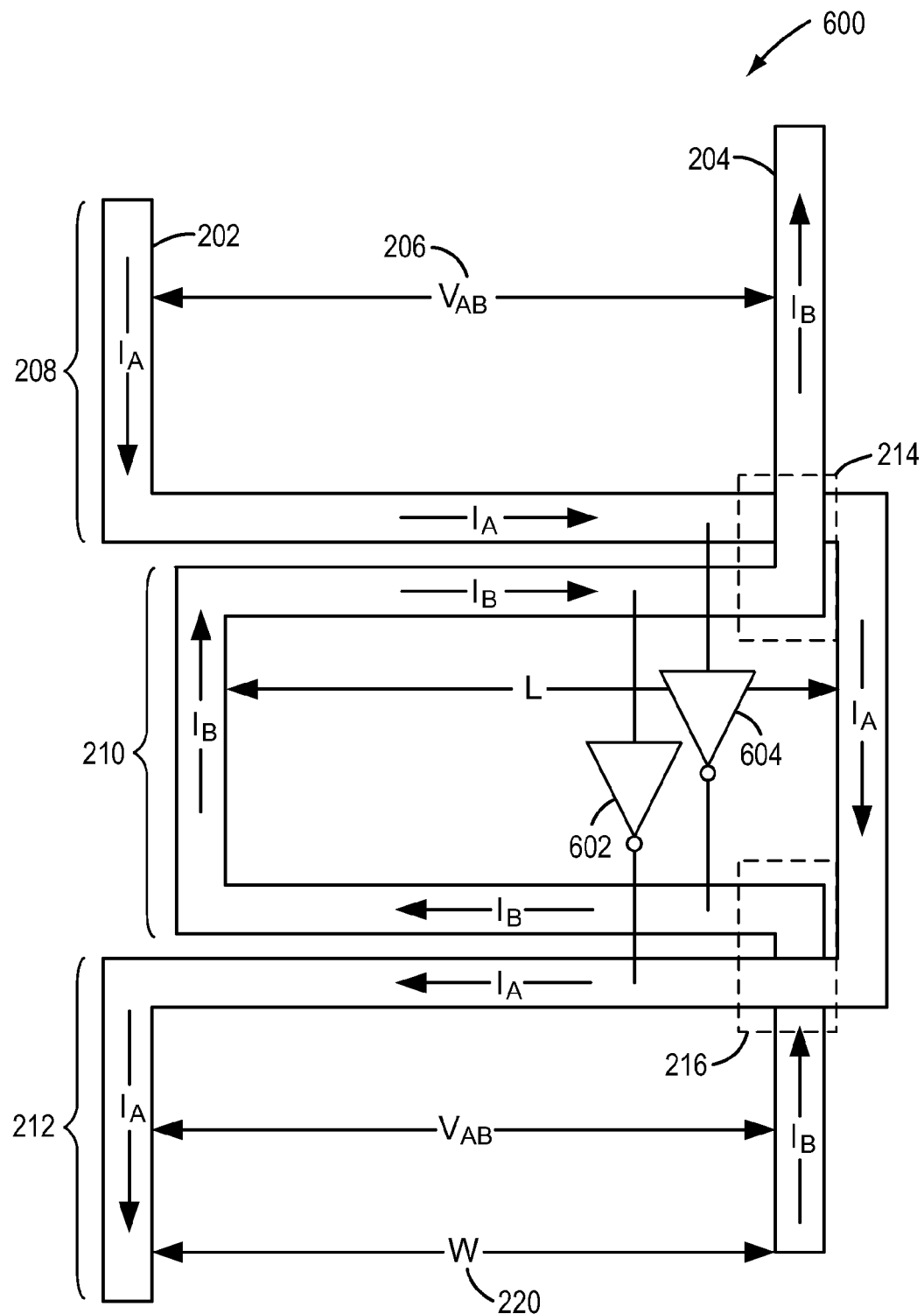
FIG. 10 shows the placement of representative regeneration elements for the embodiment of FIG. 6.
Figure 10B:
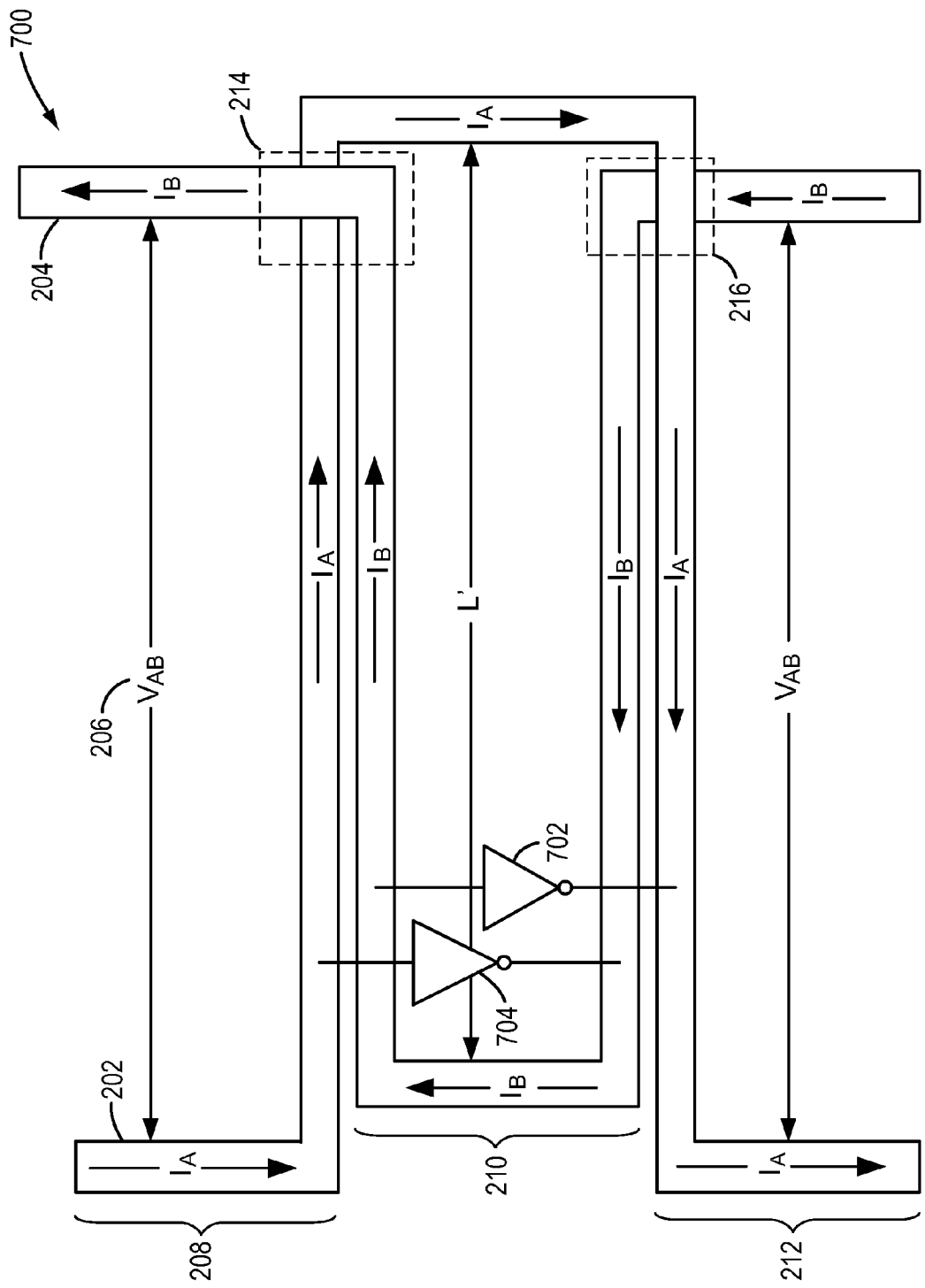

FIG. 10A shows the placement of representative regeneration elements for the embodiment of FIG. 6. As is clear from the figure, the regeneration elements 602, 604 can be conveniently located between the A conductor 202 and the B conductor 204 such that a wave traveling on the line is predisposed to travel in a particular direction. One advantage of the present invention is that the length L of the horizontal conductors can be selected to match the propagation delays of various implementations of the regeneration elements. For example, it is well known that p-type transistors are slower than n-type transistors. Thus, if regeneration elements are implemented with n-type devices, such MOS or bipolar transistors, the length of the horizontal conductors may be smaller (L in FIG. 10A<L' in FIG. 10B) than if p-type devices are used. FIG. 10A shows the case where the regeneration elements are n-type devices, which need less time. FIG. 10B shows the case where the regeneration devices 702, 704 are p-type devices, which need relatively more time.

In either embodiment, the vertical runs of a section have a different spacing compared to the horizontal runs. If the construction of the lines is the same, this makes the $Z_0$ of a vertical run different from that of a horizontal run, causing reflections at the point of mismatch. Let the relationship between the inductances be $L_h=nL_v$ (where n is about 4, due to the enhancement) and the relationship between capacitances be $C_h=mC_v$ (where m<1 due to the relative distances), where the "h" subscript refers to a horizontal run and the "v" subscript refers to a vertical run. Then, the relationship between impedances is $Z_h=Z_v\sqrt{n/m}$, indicating the presence of a significant mismatch when m is different from n. To correct the mismatch, the relationship between the capacitances must be altered so that $C_h$ is about n times larger than $C_v$. One way to do this is to increase $C_h$ by increasing the width of the horizontal run. Another way is to decrease the width and thus the $C_v$ of the vertical run. Of course, both changes can be made as well.

Figure 11:
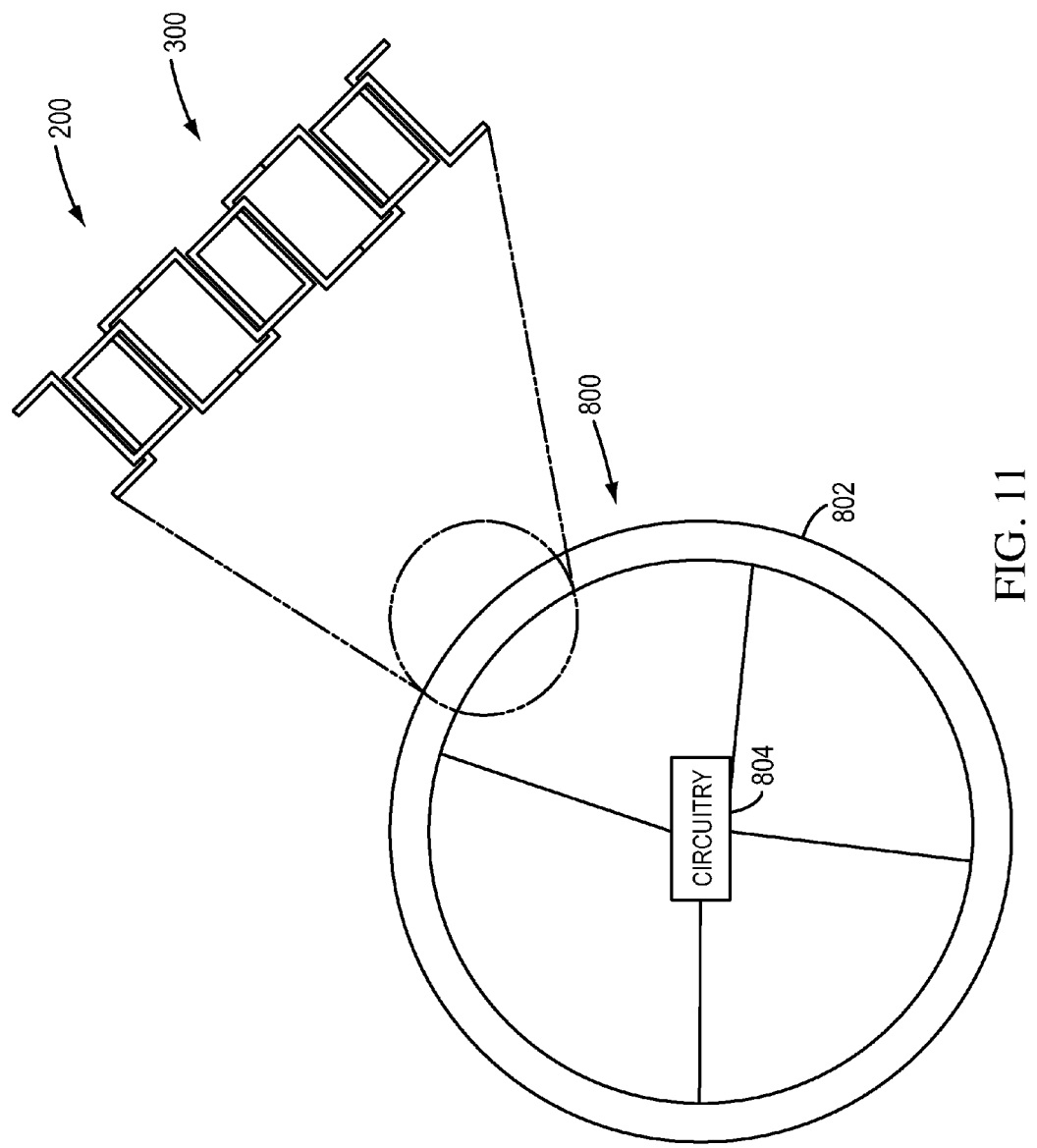
FIG. 11 shows another embodiment of the present invention in which the transmission lines of the first or second embodiment form a closed loop.

FIG. 11 shows another embodiment 800 of the present invention. In this embodiment, the top and bottom metal runs have a similar pattern to those in FIG. 6 or FIG. 7, but the vertical sides are altered so that the metal runs traverse a closed loop, such as the circle 802 shown. This arrangement permits circuitry located at or near the center of the closed loop to access more phase taps of the rotary oscillator with little or no skew, compared to other arrangements of the oscillator. Accessing more phase taps enables the circuitry to effectively operate at a higher speed compared to circuitry operating with, say, only two phases. For example, a clock operating a frequency f with N phase taps accessible permits circuitry to effectively operate at N*f.

Figure 12:
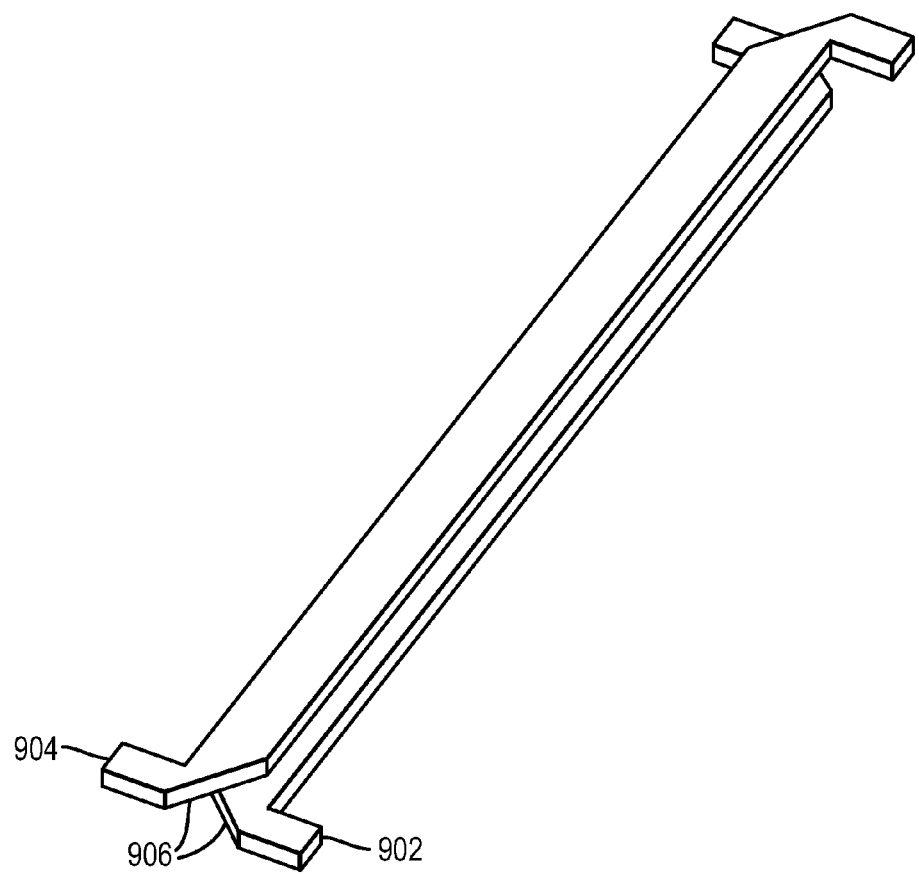
FIG. 12 shows a perspective view of a portion of the transmission line.

FIG. 12 shows a perspective view of a portion of the transmission line in which one of the metal runs overlaps the other metal run. Importantly, the width of the overlapping portion is greater than the width of the portions at right angles to the overlapping portions.

Figure 13:
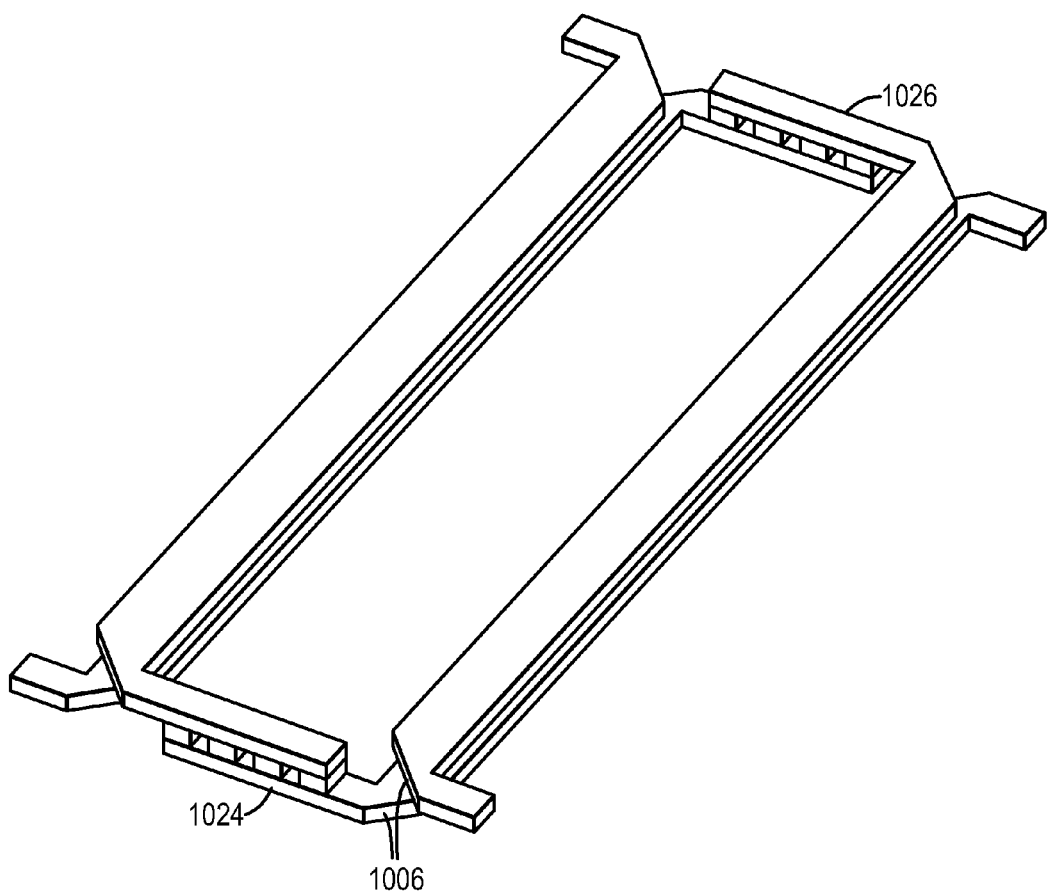
FIG. 13 shows a perspective view of a portion of the transmission line.

FIG. 13 shows a perspective view of a portion of the transmission line in which one or more feedthroughs 1024, 1026 connect the top metal run to the bottom metal run. Again, the widths of the overlapping portions are greater than those at right angles to the overlapping portions.

Although the present invention has been described in considerable detail with reference to certain preferred versions thereof, other versions are possible. For example, at high frequencies it is important to avoid transmission imperfections that lead to reflections. One kind of imperfection occurs at right angle corners of a metal run that changes direction. At these corners the width of the metal run is greater by $\sqrt{2}$, which changes the impedance of the metal run. A better way to change direction is to convert the right angle into a rounded corner or to make two 45-degree turns. Yet another way is to remove a portion of the metal run at the corner so that the distance is the same as the rest of the run. In FIGS. 11 and 12, a portion of the corner 906, 1006 is removed to maintain the impedance relative constant over the change in direction. Therefore, the spirit and scope of the appended claims should not be limited to the description of the preferred versions contained herein.

What is claimed is:

1. A rotary traveling wave oscillator comprising:
   a two-conductor transmission line with first and second conductors respectively connected to form a closed differential circuit, said two-conductor transmission line having a length that includes propagating portions and an odd number of phase reversing portions that make up a substantial portion of the length of the closed differential circuit, wherein each one of said phase reversing portions is disposed between a pair of propagating portions, and has an inductance that is higher than the inductance of the propagating portions of the circuit; and
   a plurality of regeneration devices located at various spaced-apart positions on the circuit and connected across the two-conductor transmission line, wherein the regeneration devices are operative to establish and maintain on the circuit a wave traveling around the circuit.

2. A rotary traveling wave oscillator as recited in claim 1, wherein the phase-reversing portions are approximately orthogonal to the propagating portions and the propagating portions extend in a direction of a wave traveling around the circuit.

3. A rotary traveling wave oscillator as recited in claim 2, wherein each conductor of the phase-reversing portions connects to the respective conductor of the propagating portions with rounded corners.

4. A rotary traveling wave oscillator as recited in claim 2, wherein each conductor of the phase-reversing portions connects to the respective conductor of the propagating portions with two 45-degree turns.

5. A rotary traveling wave oscillator as recited in claim 1, wherein each phase-reversing portion includes a cross-over implemented by one or more feedthroughs between the first and second conductors.

6. A rotary traveling wave oscillator as recited in claim 1, wherein said propagating portions and the phase reversing portions each have a particular impedance, said phase reversing portions having a higher impedance than the propagating portions such that the closed differential circuit has an impedance higher than the propagating portions.

7. A rotary traveling wave oscillator as recited in claim 1, wherein the two conductors of the phase reversing portions of the circuit carry currents in the same direction and the two conductors of the propagating portions of the circuit carry currents in opposite directions.

8. A rotary traveling wave oscillator as recited in claim 1,
   wherein a first regeneration device is connected between the first conductor of a first phase reversing portion and the first conductor of a second phase reversing portion; and
   wherein a second regeneration device is connected between the second conductor of the first phase reversing portion and the second conductor of the second phase reversing portion.

9. A rotary traveling wave oscillator as recited in claim 8,
   wherein the first and second regeneration devices have characteristic propagation delays; and
   wherein the first and second regeneration devices are connected between said conductors at a position on each corresponding phase reversing portion that is based on said characteristic propagation delays of said first and second regeneration devices.

10. A rotary traveling wave oscillator as recited in claim 1,
    wherein each phase reversing portion is connected to a propagating portion to form a chain-like structure; and
    wherein the chain-like structure itself forms a closed differential circuit.

11. A rotary traveling wave oscillator as recited in claim 9, wherein one or more circuits are located centrally within the closed differential circuit of the chain-like structure, said one or more circuits being connected to said closed differential circuit to receive one or more phases from the differential circuit.

12. A rotary traveling wave oscillator as recited in claim 1, wherein the two conductors of each phase reversing portion are disposed side-by-side.

13. A rotary traveling wave oscillator as recited in claim 1, wherein the two conductors of each phase reversing portion are disposed one over the other such that they fully overlap each other.

14. A rotary traveling wave oscillator as recited in claim 1, wherein the two conductors of each phase reversing portion are disposed one over the other such that they partially overlap each other.

15. A rotary traveling wave oscillator comprising:
one or more conductive segments, each segment having ends, a length of spaced apart first and second conductors therebetween, and a first characteristic inductance per unit length, each length of conductor being electrically continuous;
an odd number of passive connection means having a length of spaced apart first and second conductors coupling the ends of the one or more segments to form a closed loop of segments and the passive connection means, and having a second characteristic inductance per unit length; and
a plurality of regeneration devices located at various spaced-apart positions on the loop and connected between the first and second conductors of the one or more segments, wherein the regeneration devices are operative to establish and maintain on the loop a wave traveling around the loop, the traveling wave including a voltage wave between the first and second conductors, a single lap of the wave around the loop defining a propagation time;
wherein each of the passive connection means causes the voltage of the traveling wave between the first and second conductors of the one or more segments and the odd number of passive connection means to reverse polarity, to provide, at any location on a segment, a pair of oppositely phased oscillations having a period equal to twice the propagation time; and
wherein the first and second conductors of the passive connection means have a length that is substantially longer than the length of the segments and the second characteristic inductance is greater than the first characteristic inductance.

16. A rotary traveling wave oscillator as recited in claim 14, wherein the impedance of the loop is substantially increased due to the increased inductance of the conductors of the passive connection means.

17. A rotary traveling wave oscillator as recited in claim 14, wherein the first and second conductors of a segment carry currents in opposite directions and the first and second conductors of the passive connection means carry currents in the same direction.

18. A rotary traveling wave oscillator as recited in claim 14, wherein the first and second conductors of a passive connection means are routed so as to be disposed on two boundary sides of an area, the other two boundary sides of which are the first and second conductors of a segment.

19. A rotary traveling wave oscillator as recited in claim 14,
wherein a first passive connection means is connected between a first conductive segment and a second conductive segment and a second passive connection means is connected between the second conductive segment and a third conductive segment; and
wherein a first regeneration device is connected between the first conductor of the first passive connection means and the first conductor of the second passive connection means and a second regeneration device is connected between the second conductor of the first passive connection means and the second conductor of the second passive connection means.

* * * * *